(12) United States Patent
Liu et al.

(10) Patent No.: US 7,265,389 B2
(45) Date of Patent: Sep. 4, 2007

(54) LIGHT EMITTING DIODE AND FABRICATING METHOD THEREOF

(75) Inventors: Cheng-Yi Liu, Taoyuan (TW); Yuan-Tai Lai, Taipei (TW); Shen-Jie Wang, Taipei (TW)

(73) Assignee: National Central University, Taoyuan (TW)

( * ) Notice: Subject to any disclaimer, the term of this patent is extended or adjusted under 35 U.S.C. 154(b) by 75 days.

(21) Appl. No.: 11/163,314

(22) Filed: Oct. 14, 2005

(65) Prior Publication Data

US 2006/0141644 A1    Jun. 29, 2006

(30) Foreign Application Priority Data

Dec. 28, 2004    (TW)    ............................... 93140883 A

(51) Int. Cl.
*H01L 27/15*    (2006.01)
*H01L 21/00*    (2006.01)

(52) U.S. Cl. ............................ 257/79; 257/80; 257/82; 438/22; 438/24; 438/34; 438/39

(58) Field of Classification Search ................ 438/22, 438/24, 25, 34, 39; 257/79–82, 88
See application file for complete search history.

(56) References Cited

U.S. PATENT DOCUMENTS

2006/0102925 A1*    5/2006    Liu et al. .................... 257/103

\* cited by examiner

*Primary Examiner*—Hsien-Ming Lee
(74) *Attorney, Agent, or Firm*—Jianq Chyun IP Office

(57) ABSTRACT

A method for fabricating a light emitting diode (LED) is provided. Successively forming a first type doped semiconductor layer, a light emitting layer and a second type doped semiconductor layer on an epitaxy substrate; forming a bonding layer thereon; bonding a transferring substrate with the bonding layer; removing the epitaxy substrate; removing a part of the first type doped semiconductor layer, the light emitting layer and the second type doped semiconductor layer for exposing a part of the bonding layer; patterning the bonding layer to form a first and a second bonding portion isolated from each other, wherein the first type doped semiconductor layer, the light emitting layer and the second type doped semiconductor layer are disposed on the first bonding portion; forming a pad on the first type doped semiconductor layer; and forming a conducting wire for electrically connecting the pad and the second bonding portion.

17 Claims, 8 Drawing Sheets

US 7,265,389 B2

LIGHT EMITTING DIODE AND FABRICATING METHOD THEREOF

CROSS-REFERENCE TO RELATED APPLICATION

This application claims the priority benefit of Taiwan application serial no. 93140883, filed on Dec. 28, 2004. All disclosure of the Taiwan application is incorporated herein by reference.

BACKGROUND OF THE INVENTION

1. Field of the Invention

The present invention relates to a diode and a fabricating method thereof, and particularly to a light emitting diode (LED) and a fabricating method thereof.

2. Description of Related Art

The group IIIA nitrides have broader energy gaps, therefore LEDs made of such can emit lights of a large band range from ultraviolet band to red light band which almost covers all of the visible band. Nowadays, the use of the group IIIA nitride semiconductors including GaN, AlGaN, InGaN becomes more and more attractive. Comparing to conventional light bulbs, such LEDs have outstanding advantages including smaller volume, longer lifetime, lower driving voltage, invulnerableness, less contamination and higher light emitting efficiency; therefore, LEDs are more and more widely used in commerce.

Referring to FIG. 1, a schematic cross-sectional view of a conventional LED is illustrated. The conventional LED 100 includes an $Al_2O_3$ substrate 110, an epitaxy buffer layer 120, a doped semiconductor layer 132, a light emitting layer 134 and a doped semiconductor layer 136. The epitaxy buffer layer 120 is disposed on the $Al_2O_3$ substrate 110, and the doped semiconductor layer 132 is disposed on the epitaxy buffer layer 120. The light emitting layer 134 is disposed on a part of the doped semiconductor layer 132, and the doped semiconductor layer 136 is disposed on the light emitting layer 134. It is to be noted that the doped semiconductor layer 132 and the doped semiconductor layer 136 are different types. For example, the doped semiconductor layer 132 is a P-type doped semiconductor layer, while the doped semiconductor layer 136 is an N-type doped semiconductor layer.

Furthermore, a portion of the doped semiconductor layer 132 will be exposed after an etching process. Therefore, the conventional LED 100 further includes a pair of pads 142 and 144 respectively disposed on and electrically connected with the exposed portion of the doped semiconductor layer 132 and the doped semiconductor layer 136. An ohmic contacting layer 152 is disposed between the pad 142 and the doped semiconductor layer 136, and another second ohmic contacting layer 154 is disposed between the pad 144 and the doped semiconductor layer 132. It should be noted that the conventional LED 100 is usually electrically connected with the circuit board or other carriers (not shown) by wire bonding technology or flip chip technology, wherein the pads 142 and 144 are the contacting points for electrically connection.

In the foregoing LED 100, the $Al_2O_3$ substrate 110 has poor heat dissipation. Therefore, after a long time of light emission, the temperature of the light emitting layer 134 will increase and the light emitting efficiency of which will decrease accordingly. Furthermore, the pad 142 shelters a part of emitted light and consequently affect the light emitting efficiency, while disposing the pads 144 also reduces a part of light emitting area. Moreover, because a current crowding effect occurs at the pads 142 and 144, which causes excessive current thereby, the doped semiconductor layer 132 and the doped semiconductor layer 136 will be damaged at the portions near the pads 142 and 144. As a result, the LED 100 can not function properly.

FIG. 2A is a schematic cross-sectional view of another conventional LED. Referring to FIG. 2A, the conventional LED 200a includes a transferring substrate 210a, a bonding layer 220a, a doped semiconductor layer 232a, a light emitting layer 234a and a doped semiconductor layer 236a. The bonding layer 220a is disposed on the transferring substrate 210a, and the doped semiconductor layer 232a is disposed on the bonding layer 220a. The light emitting layer 234a is disposed between the doped semiconductor layer 232a and the doped semiconductor layer 236a. It is to be noted that the doped semiconductor layer 232a, the light emitting layer 234a and the doped semiconductor layer 236a are originally formed on a same epitaxy substrate (not shown). They are consequentially transferred to the transferring substrate 210a, while the bonding layer 220a is adapted for sticking the transferring substrate 210a and the doped semiconductor layer 232a.

Similarly, a pad 242a is usually disposed on the doped semiconductor layer 236a, and an ohmic contacting layer 252a is disposed between the pad 242a and the second doped second semiconductor layer 236a. The pad 242a has the same utility and function of the pads 142 and 144 in FIG. 1. Herein, the transferring substrate 210a and the bonding layer 220a are electrically conductive. Therefore, when the conventional LED 200a is disposed on a circuit board or other carriers, it can be electrically connected with the circuit board via the transferring substrate 210a directly and electrically connected with the circuit board via a conducting wire (not shown) bonding on the pad 242a. However, such a conventional LED 200a requires a relatively high driving voltage.

FIG. 2B is a schematic cross-sectional view of another conventional LED. Referring to FIG. 2B, the conventional LED 200b includes a transferring substrate 210b, a bonding layer 220b, a doped semiconductor layer 232b, a light emitting layer 234b and a doped semiconductor layer 236b. The bonding layer 220b is disposed on the transferring substrate 210b, and the doped semiconductor layer 232b is disposed on the bonding layer 220b. The light emitting layer 234b is disposed on a part of the doped semiconductor layer 232b, and the doped semiconductor layer 236b is disposed on the light emitting layer 234b. Pads 242b and 244b are respectively disposed on the doped semiconductor layer 236b and the exposed doped semiconductor layer 232b after an etching process. Furthermore, the transferring substrate 210b is made of semiconductor materials or nonconductive materials.

It is to be noted that ohmic contacting layers 250b and 252b are employed between the pads 244b, 242b and the doped semiconductor layers 232b, 236b for improving the interface properties therebetween. However, employing extra ohmic contacting layers means extra fabrication cost and extra processing.

SUMMARY OF THE INVENTION

An object of the present invention is to provide a method for fabricating an LED having better light emitting efficiency.

Another object of the present invention is to provide an LED having proper current distribution.

According to the foregoing objects and others, the present invention provides a method for fabricating an LED. The method includes the steps of: first, successively forming a first type doped semiconductor layer, a light emitting layer and a second type doped semiconductor layer on an epitaxy substrate; then, forming a bonding layer on the second type doped semiconductor layer; bonding a transferring substrate with the bonding layer of the epitaxy substrate; removing the epitaxy substrate; then removing a part of the first type doped semiconductor layer, the light emitting layer and the second type doped semiconductor layer to expose a part of a surface of the bonding layer; patterning the bonding layer to form a first bonding portion and a second bonding portion which are isolated from each other, wherein the first type doped semiconductor layer, the light emitting layer and the second type doped semiconductor layer are disposed on the first bonding portion; forming a first pad on the first type doped semiconductor layer; and forming a conducting wire for electrically connecting the first pad and the second bonding portion.

According to an aspect of an embodiment of the invention, before the step of forming the foregoing conducting wire, the method for fabricating an LED further includes: forming a second pad on the first bonding portion and forming a third pad on the second bonding portion, wherein the second pad is electrically connected with the second type doped semiconductor layer via the first bonding portion, and the conducting wire is adapted for electrically connecting the first pad and the third pad.

According to an aspect of an embodiment of the invention, the step of removing a part of the first type doped semiconductor layer, the light emitting layer and the second type doped semiconductor layer further includes forming a plurality of semiconductor island structures.

According to an aspect of an embodiment of the invention, before the foregoing step of forming a first type doped semiconductor layer, the method for fabricating an LED further includes forming an epitaxy buffer layer; and after the step of removing the epitaxy substrate, the method for fabricating an LED further includes removing the epitaxy buffer layer.

According to an aspect of an embodiment of the invention, before the foregoing step of forming a bonding layer, the method for fabricating an LED further includes: forming an ohmic contacting layer on the second type doped semiconductor layer; and forming a reflective layer on the ohmic contacting layer.

According to an aspect of an embodiment of the invention, the foregoing step of removing the epitaxy substrate may be a laser lift-off processing. The laser lift-off processing may be performed with a quasi-molecule laser.

According to the foregoing objects and others, the present invention provides an LED. The LED includes a substrate, a bonding layer, a semiconductor layer, a first pad and a conducting wire. The bonding layer is disposed between the substrate and the semiconductor layer. The bonding layer includes a first bonding portion and a second bonding portion which are isolated from each other. The semiconductor layer is disposed on the first bonding portion, including a first type doped semiconductor layer, a light emitting layer and a second type doped semiconductor layer. The first type doped semiconductor layer is disposed on the bonding layer, and the light emitting layer is disposed between the first type doped semiconductor layer and the second type doped semiconductor layer. The first pad is disposed on the second type doped semiconductor layer, and the conducting wire is adapted for electrically connecting the first pad with the second bonding portion.

According to an aspect of an embodiment of the invention, the foregoing LED further includes a second pad and a third pad. The second pad is disposed on the first bonding portion and is electrically connected with the first type doped semiconductor layer via the first bonding portion. The third pad is disposed on the second bonding layer, and the conducting wire is adapted for electrically connecting the first pad with the third pad.

According to an aspect of an embodiment of the invention, the foregoing semiconductor layer includes a plurality of semiconductor island structures.

According to an aspect of an embodiment of the invention, the foregoing LED further includes an ohmic contacting layer disposed on the bonding layer. The foregoing LED further includes a reflective layer disposed between the ohmic contacting layer and the bonding layer.

According to an aspect of an embodiment of the invention, the foregoing first type doped semiconductor layer is an N-type doped semiconductor layer, and the second type doped semiconductor layer is a P-type doped semiconductor layer. Alternatively, the foregoing first type doped semiconductor layer is a P-type doped semiconductor layer, and the second type doped semiconductor layer is an N-type doped semiconductor layer According to an aspect of an embodiment of the invention, the foregoing light emitting layer may be a multiple quantum well semiconductor layer.

According to the above and comparing to the conventional LEDs which only use a conducting wire, the present invention inputs a driving voltage via a bonding layer. The LED according to the present invention does not only have better current distribution, but also more contacting area (light emitting area). Moreover, the method for fabricating an LED integrates a plurality of semiconductor island structures to a transferring substrate, by which times of wire bonding processing can be reduced and even an LED array can be fabricated.

BRIEF DESCRIPTION OF THE DRAWINGS

The features of the invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DESCRIPTION OF THE EMBODIMENTS

The First Embodiment

Figure 3A:
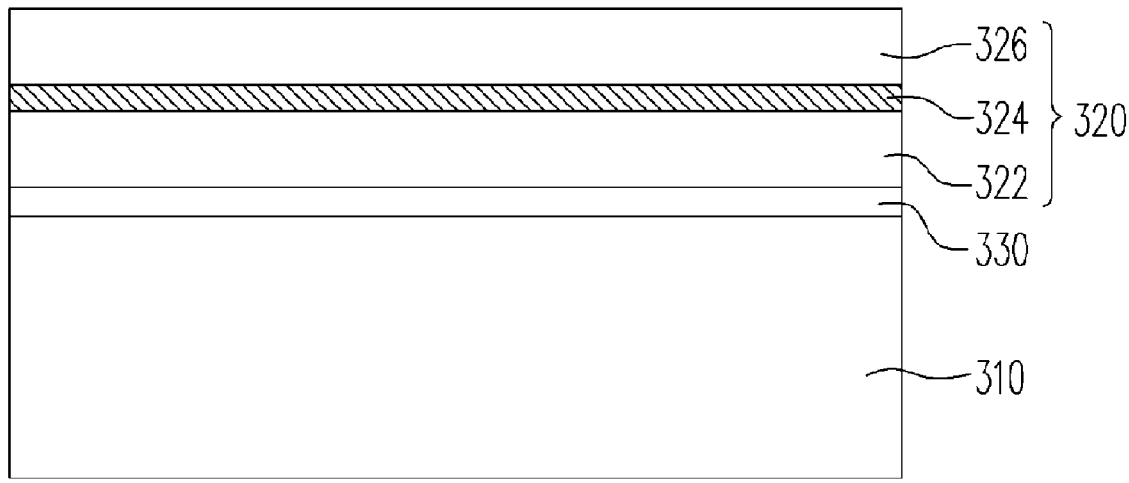
FIGS. 3A through 3D are schematic cross-sectional views of an LED illustrating a method for fabricating the LED according to a first preferred embodiment of the invention.

FIGS. 3A through 3D are schematic cross-sectional views of an LED illustrating a method for fabricating the LED according to a first preferred embodiment of the invention. Referring to FIG. 3A, according to the first embodiment of the invention, a method for fabricating an LED includes: preparing an epitaxy substrate 310; successively forming a first type doped semiconductor layer 322, a light emitting layer 324 and a second type doped semiconductor layer 326 on the epitaxy substrate 310 with epitaxy processing. The processes for forming the first type doped semiconductor layer 322, the light emitting layer 324 and the second type doped semiconductor layer 326 can be a metal organic chemical vapor deposition (MOCVD) process, a molecular beam epitaxy (MBE) process, a hydride vapor phase epitaxy (HVPE) process or other proper processes.

The materials of the epitaxy substrate 310 can be selected from a group consisting of Si, GaAs, GaN, AlGaAs, GaP, SiC, InP, BN, $Al_2O_3$, AlN or $LiGaO_2$. It is to be noted that in order to improve the electric property of the doped semiconductor layer 322, before it is formed, an epitaxy buffer layer 330 can be formed on the epitaxy substrate 310.

Figure 3B:
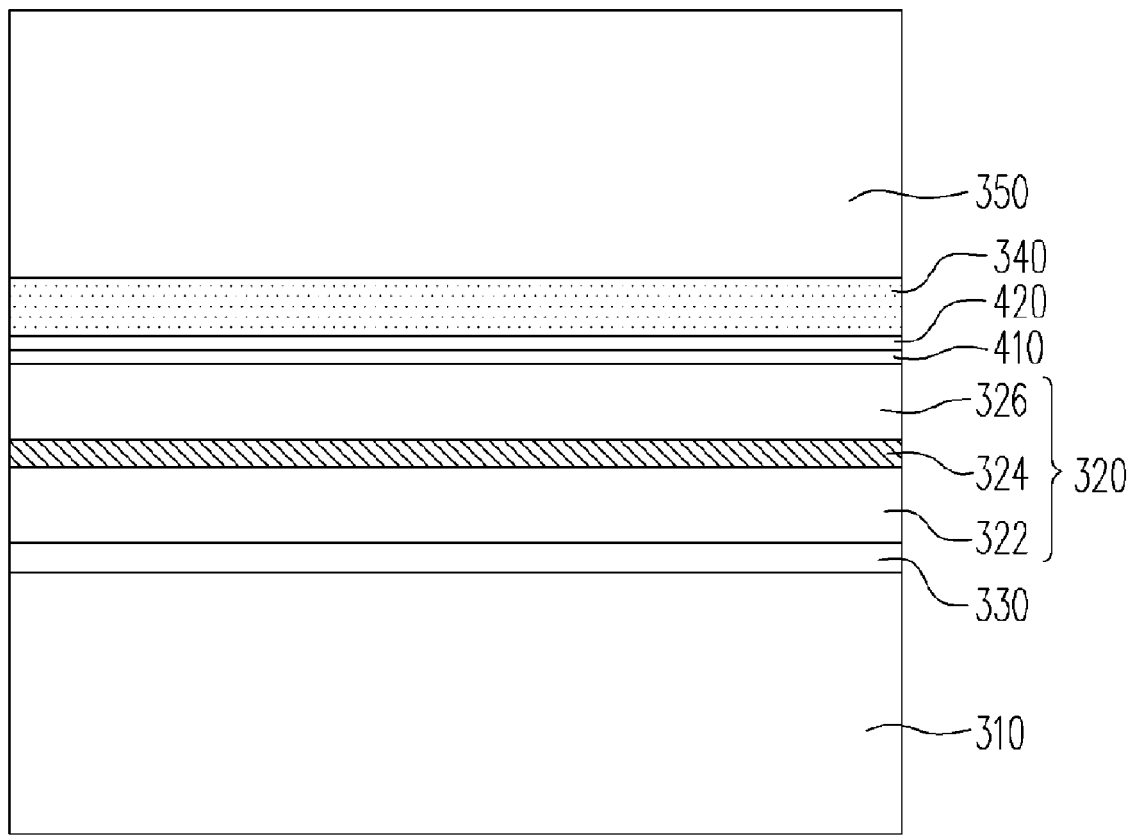

Referring to FIG. 3B, the step for forming a bonding layer 340 onto the doped semiconductor layer 326 is illustrated. The material of the bonding layer 340, for example, can be selected from a group consisting of metal, alloy, soldering tin or conducting resin. The bonding layer 340 is electrically connected with the doped semiconductor layer 326. Then, a transferring substrate 350 is provided. The transferring substrate, for example, can be made of semiconductors or non-semiconductors including Si, AlN, BeO and Cu. Then, the transferring substrate 350 is bonded with the bonding layer 340 of the epitaxy substrate 310. For example, a wafer bonding process can be performed to bond the transferring substrate 350 with the bonding layer 340. Herein, the bonding between the transferring substrate 350 and the bonding layer 340, for example, can be Au—Si, Au—Ge, Au—Sn, Pd—In or Pb—Sn bonding.

As shown in FIG. 3B, in order to obtain a better light emitting efficiency, before the step of forming the bonding layer 340, a reflective layer 420 is preformed on the doped semiconductor layer 326. The reflective layer 420 can be made of Al or Ag. Furthermore, an ohmic contacting layer 410 is formed on the doped semiconductor layer 326 before the step of forming the reflective layer 420 for improving the interface properties between the reflective layer 420 and the doped semiconductor layer 326. For example, when the doped semiconductor layer 326 is a P-type doped semiconductor layer, the ohmic contacting layer 410 can be made of Ni/Au. It should be noted that the reflective layer 420 and the ohmic contacting layer 410 are not exclusively needed in the embodiment.

Figure 3C:
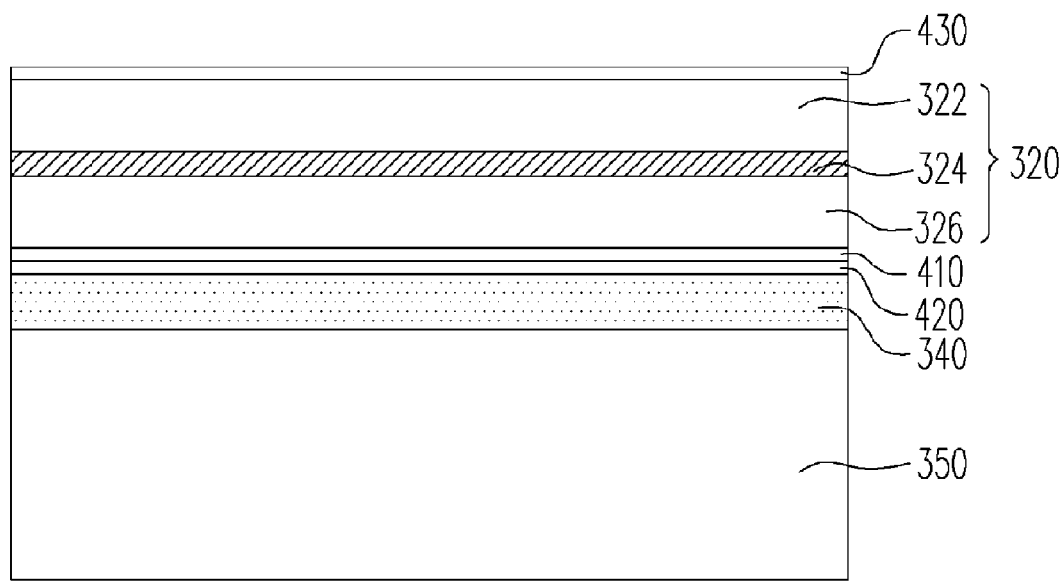

Referring to FIG. 3C, the epitaxy substrate 310 is removed after the wafer bonding processing. The method for removing the epitaxy substrate 310 can be a laser lift-off process. The laser lift-off processing may be performed with a quasi-molecule laser. The quasi-molecule laser can be KrF laser whose wavelength is 248 nm or Nd:YAG laser. It is to be noted that if an epitaxy buffer layer 330 is formed therein, then the epitaxy buffer layer 330 should be removed after the epitaxy substrate 310 is removed. The method for removing the epitaxy buffer layer 330 can be an etching process or other proper processes.

Figure 3D:
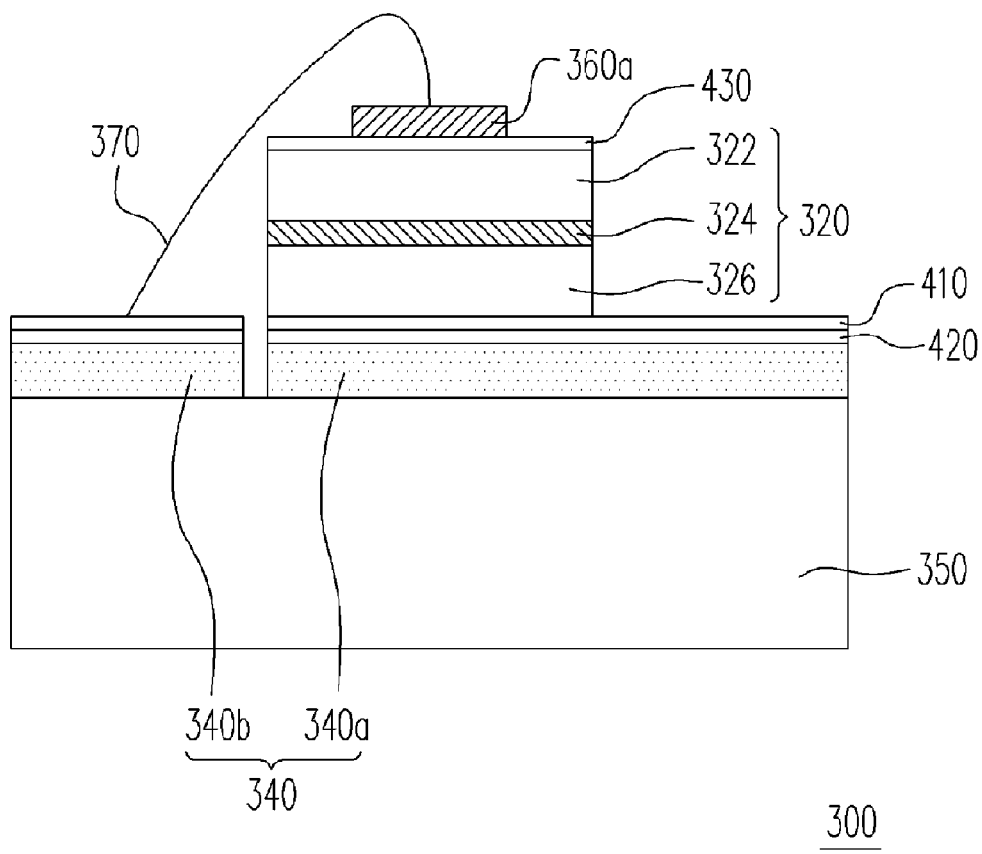

Referring to FIG. 3D, after the epitaxy substrate 310 is removed, a part of the doped semiconductor layer 322, the light emitting layer 324 and the doped semiconductor layer 326 are removed for exposing a part of a surface of the bonding layer 340. The method for removing the part of the doped semiconductor layer 322, the light emitting layer 324 and the doped semiconductor layer 326 can be an etching process. The etching process can be a chemically etching process or a physically etching process.

Then, the bonding layer 340 is patterned for forming a first bonding portion 340a and a second bonding portion 340b. Wherein, the doped semiconductor layer 322, the light emitting layer 324 and the second type doped semiconductor layer 326 are disposed on the first bonding portion 340a. The first bonding portion 340a and the second bonding portion 340b are isolated from each other. Then, a pad 360a is disposed on the first type doped semiconductor layer 322. Next, a conducting wire 370 is formed for electrically connecting the first pad 360a and the second bonding portion 340b. Herein, the method for forming the conducting wire 370 can be a wire bonding process. It is to be noted that an ohmic contacting layer 430 can be preformed on the doped semiconductor layer 322 (as shown in FIGS. 3C and 3D) before the pad 360a is formed therein for improving the interface properties between the pad 360a and the doped semiconductor layer 322.

As shown in FIG. 3D, the LED 300 includes a transferring substrate 350, an ohmic contacting layer 410, a reflective layer 420, a bonding layer 340, a semiconductor layer 320, an ohmic contacting layer 430, a conducting wire 370 and a pad 360a. The bonding layer 340 is disposed between the transferring substrate 350 and the semiconductor layer 320. The bonding layer 340 includes a first bonding portion 340a and a second bonding portion 340b, which are isolated from each other. The reflective layer 420 and the ohmic contacting layer 410 are disposed in turn on the bonding layer 340. The semiconductor layer 320 includes a doped semiconductor layer 322, a doped semiconductor layer 326 and a light emitting layer 324 disposed between the doped semiconductor layer 322 and the doped semiconductor layer 326. The ohmic contacting layer 430 is disposed on the doped semiconductor layer 322, and the pad 360a is disposed on the ohmic contacting layer 430. The conducting wire 370 is adapted for electrically connecting the pad 360a with the second bonding portion 340b.

To the semiconductor layer 320, if the first type doped semiconductor layer 322 is an N-type doped semiconductor layer, then the second type doped semiconductor layer 326 is a P-type doped semiconductor layer. Otherwise, if the first type doped semiconductor layer 322 is a P-type doped semiconductor layer, the second type doped semiconductor layer 326 is an N-type doped semiconductor layer. The materials for making the light emitting layer 324 can be □-□compound semiconductors having a multiple quantum well structure. The compound semiconductors can be GaN, AlGaN, AlN, InGaN, InN, GaInAsN or GaInPN.

Figure 1:
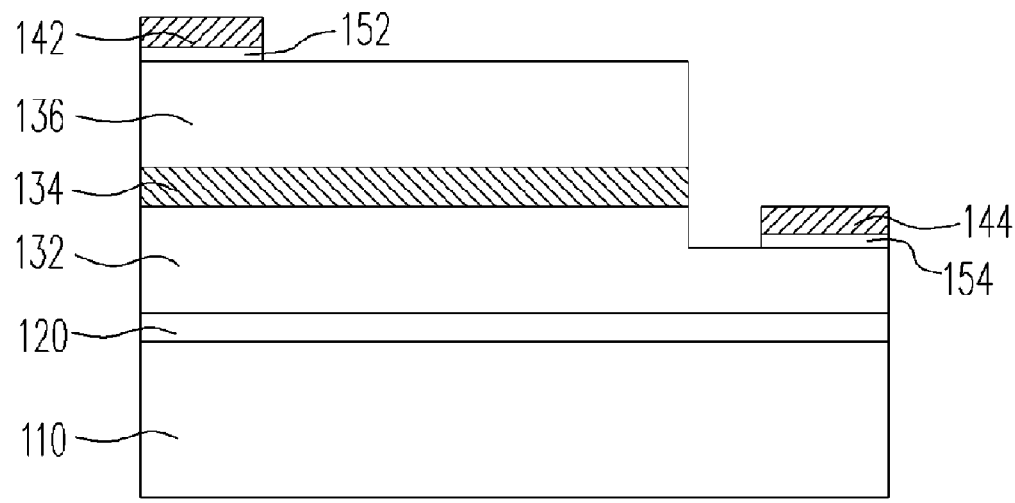
FIG. 1 is a schematic cross-sectional view of a conventional LED.
Figure 2A:
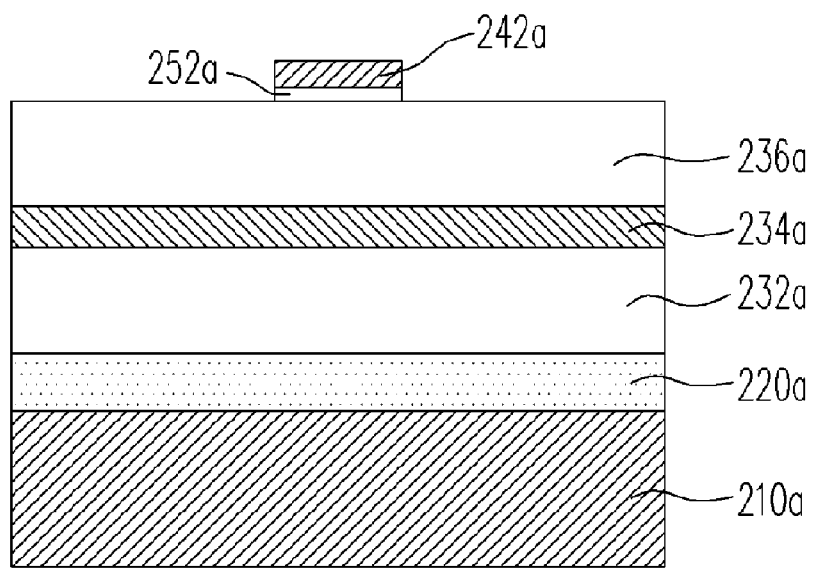
FIG. 2A is a schematic cross-sectional view of another conventional LED.

Differing from the conventional LED as shown in FIG. 1, the present invention inputs a driving voltage via a bonding layer 340. The LED according to the present invention does not only have better current distribution, but also more contacting area (light emitting area). In other words, the LED 300 according to the present invention has better light emitting efficiency. Furthermore, differing from the conventional LED as shown in FIG. 2A, the driving voltage according to the present invention is applied to the doped semiconductor layer 326 via a bonding layer 340. Therefore, the LED according to the present invention requires a lower driving voltage.

Figure 2B:
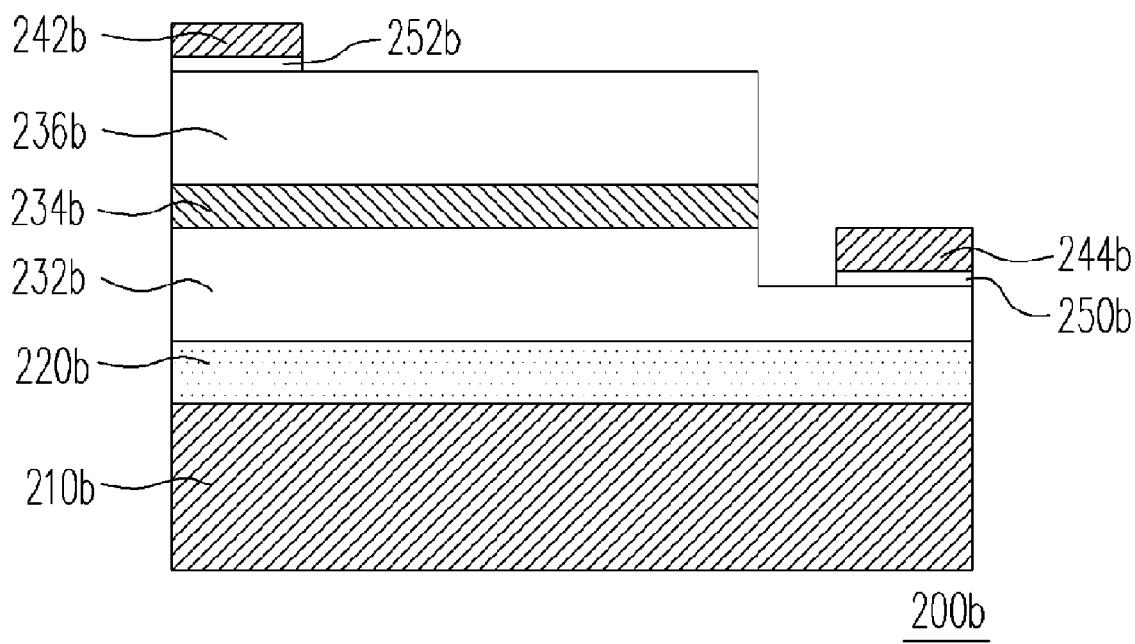
FIG. 2B is a schematic cross-sectional view of still another conventional LED.

Differing from the conventional LED as shown in FIG. 2B, rather than forming the ohmic contacting layer 250b by etching the doped semiconductor layer 232b, the ohmic contacting layer 410 is directly formed on the doped semiconductor layer 326. Therefore, the method for fabricating the LED 300 according to the present invention is relatively simple. Moreover, the method for fabricating the LED 300 is compatible with current processing; therefore, an LED 300 having better electric properties and better light emitting efficiency according to the present invention can be fabricated without extra processing equipments.

The Second Embodiment

Figure 4A:
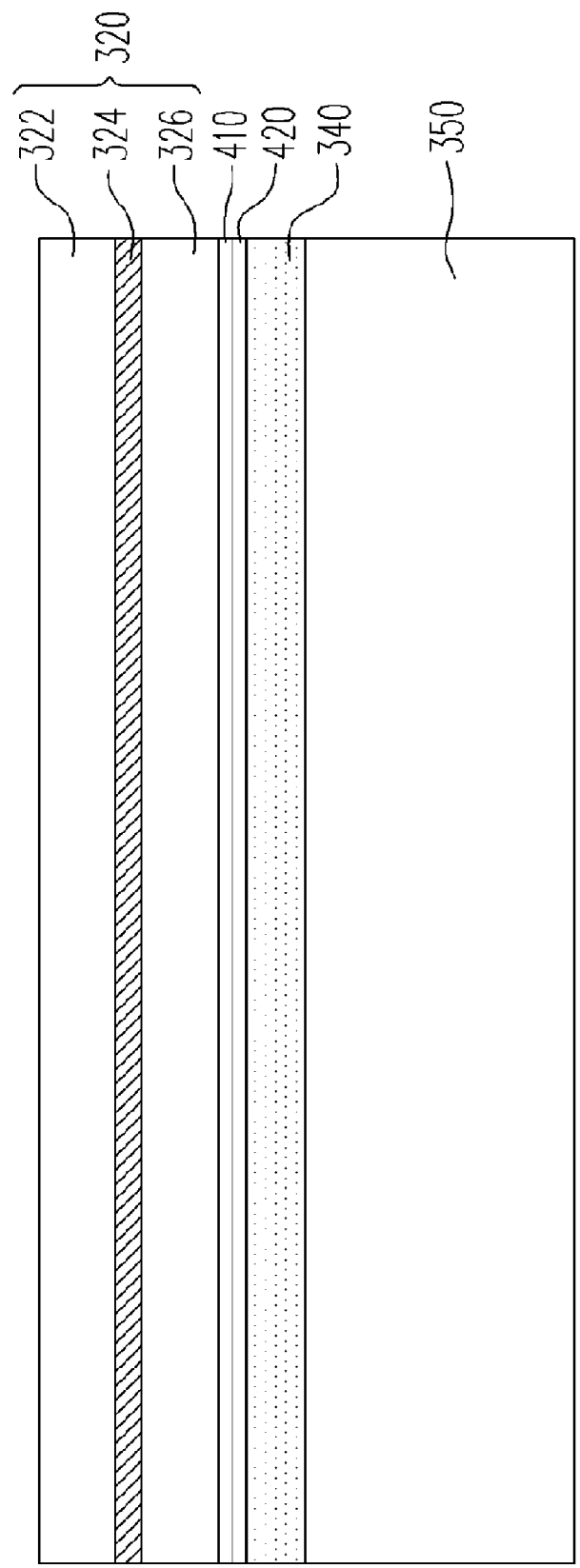
FIGS. 4A through 4C are schematic cross-sectional views of an LED illustrating a method for fabricating the LED according to a second preferred embodiment of the invention.
Figure 4B:
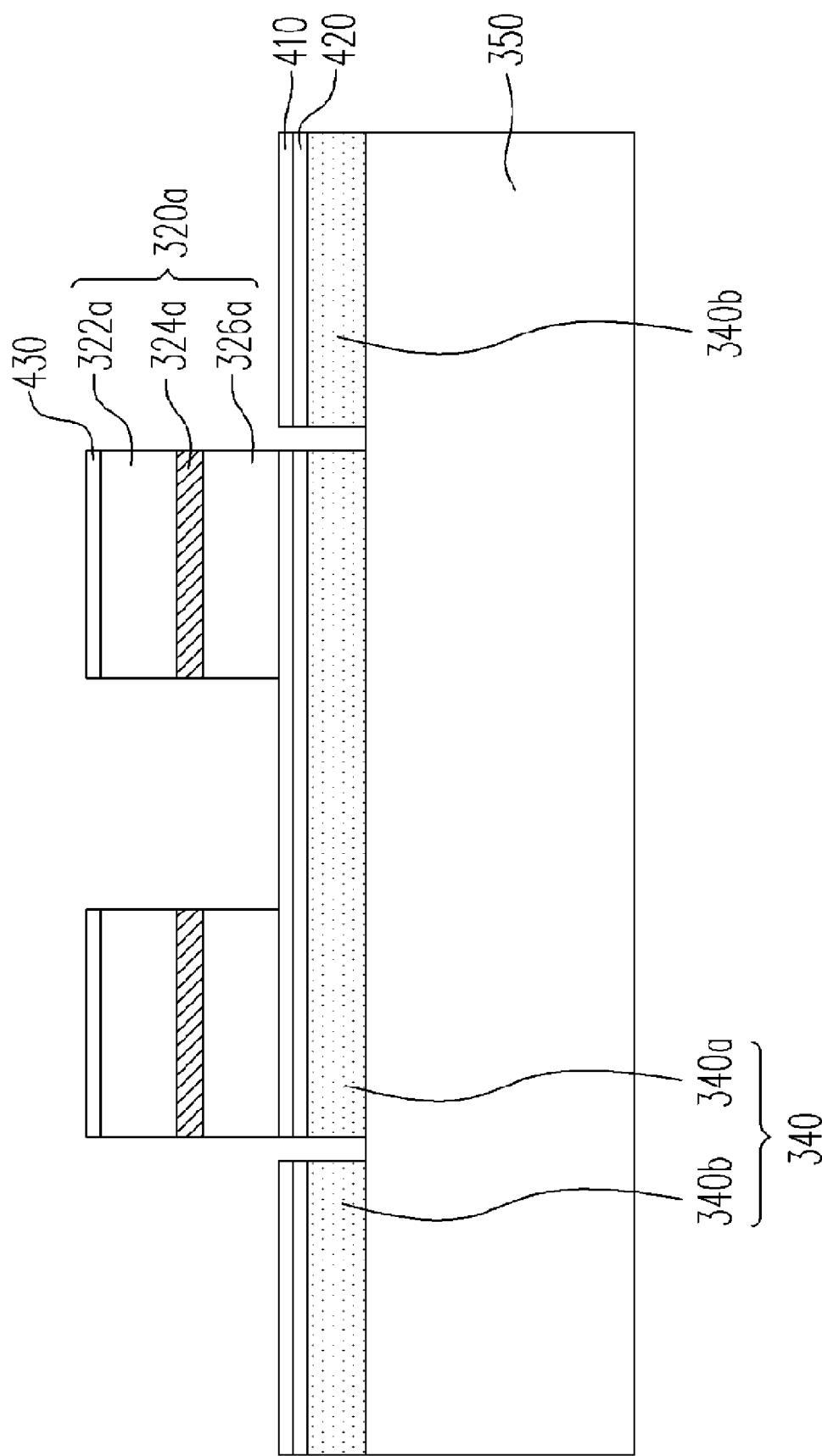
Figure 4C:
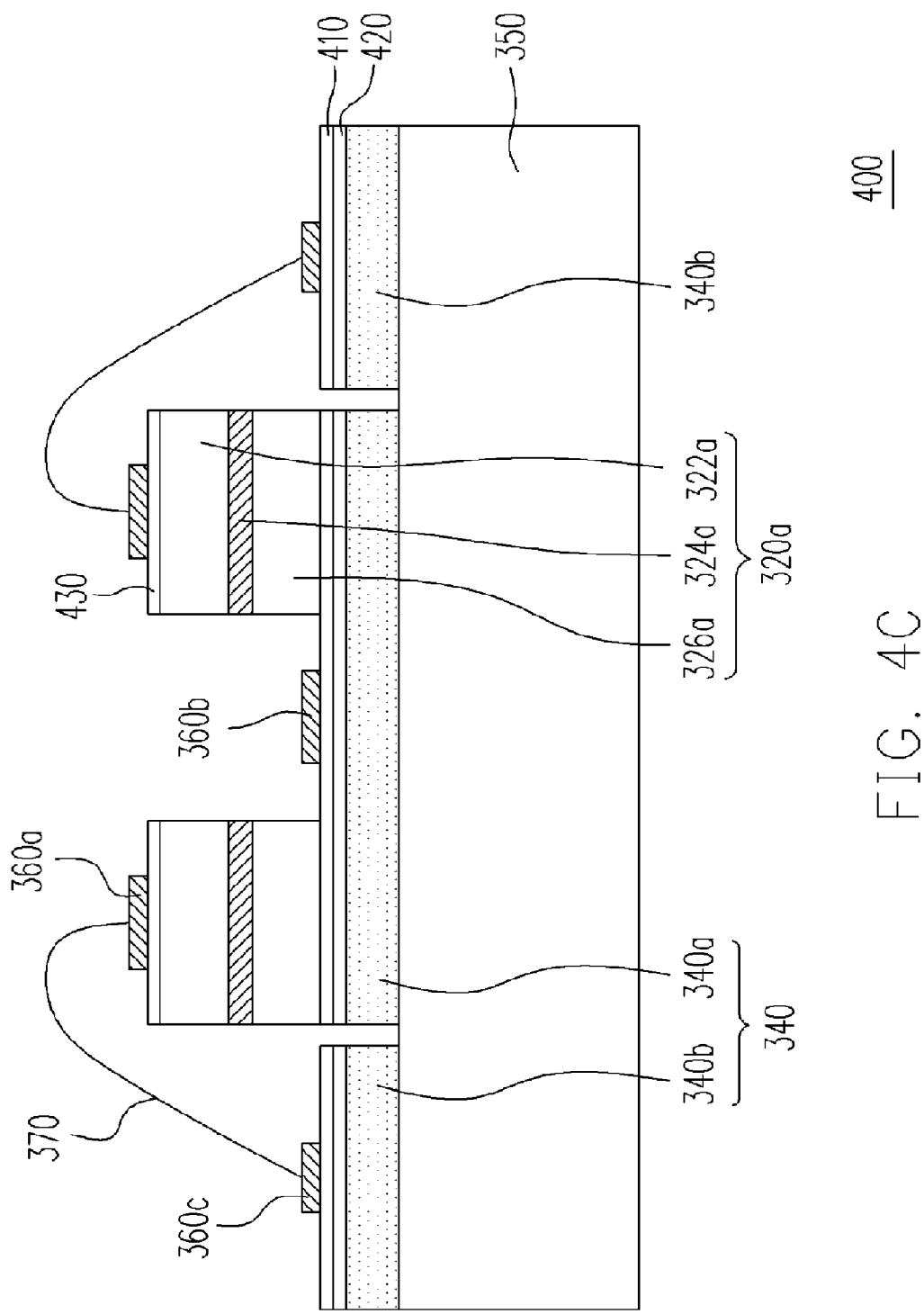

FIGS. 4A through 4C are schematic cross-sectional views of an LED illustrating a method for fabricating the LED according to a second preferred embodiment of the invention. Referring to FIG. 3B, an epitaxy buffer layer 330, a doped semiconductor layer 322, a light emitting layer 324, a doped semiconductor layer 326, a reflective layer 410 and an ohmic contacting layer 420 are formed on an epitaxy substrate 310. Then, a wafer bonding process and a laser lift-off process are performed to form a structure as shown in FIG. 4A.

Referring to FIG. 4B, an ohmic contacting layer 430 is formed on the doped semiconductor layer 322. The doped semiconductor layer 326, the light emitting layer 324 and the doped semiconductor layer 322 are then etched to form a plurality of semiconductor island structures 320a and to expose a part of the ohmic contacting layer 410. Each semiconductor island structure 320a includes a doped semiconductor layer 326a, a light emitting layer 324a and a doped semiconductor layer 322a. Then, the bonding layer 340 is patterned for forming a first bonding portion 340a and a second bonding portion 340b, which are isolated from each other. For example, the first bonding portion 340a and the second bonding portion 340b are formed by etching a part of the ohmic contacting layer 410, the reflective layer 420 and the bonding layer 340 until a part of the transferring substrate 350 is exposed.

Referring to FIG. 4C, a pad 360a is formed on each doped semiconductor layer 322a. It is to be noted that in order to obtain an LED 400 having better electric properties a pad 360b is formed on the first bonding portion 340a, and a plurality of pads 360c are formed on the second bonding portion 340b when the pad 360a is formed on the doped semiconductor layer 322a. Thereafter, a plurality of conducting wires 370 is provided for connecting the pads 360a and the pads 360c, and therefore forming an LED 400. The structure of the LED 400 is described in detail as below.

Figure 4D:
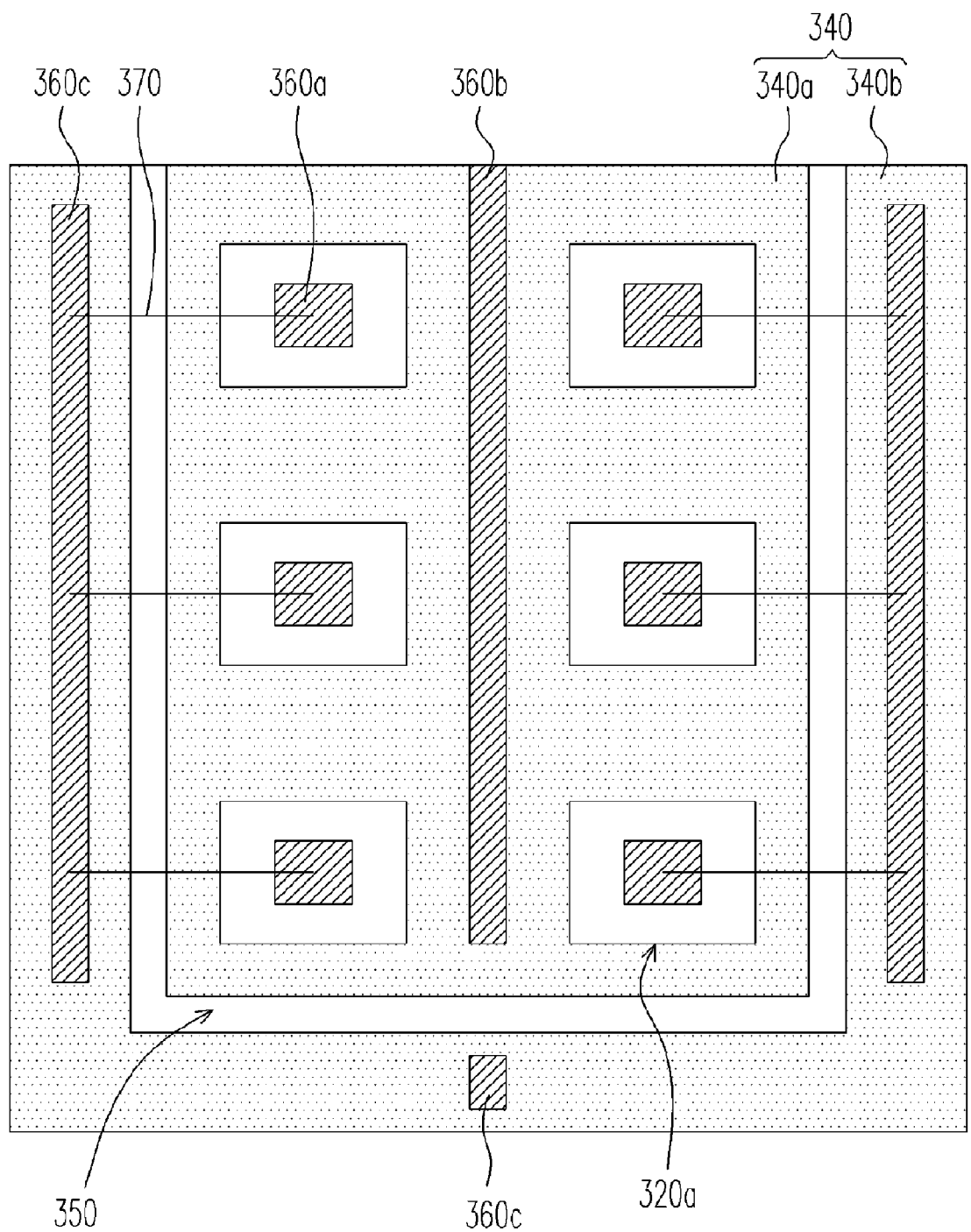
FIG. 4D is a top view of an LED according to the second preferred embodiment of the invention.

As shown in FIG. 4D, a top view of an LED according to the second preferred embodiment of the invention is illustrated. Referring to FIGS. 4C and 4D, an LED 400 includes a transferring substrate 350, a bonding layer 340, a plurality of semiconductor structures 320a and a plurality of conducting wires 370. The bonding layer 340 includes a first bonding portion 340a and a second bonding portion 340b. The semiconductor island structures 320a are disposed on the first bonding portion 340a. Also, each pad 360a is disposed on a corresponding semiconductor island structure 320a. Each conducting wire 370 is adapted for electrically connecting a corresponding pad 360a and a corresponding pad 360c of the second bonding portion 340b.

It should be noted that the LED 400 according to the present invention employs a combination of the conducting wires 370 and the first bonding portion for applying a driving voltage to each of the semiconductor island structures 320a. In other words, the present invention requires less conducting wires 370. The present invention is adapted for integrating a plurality of semiconductor island structures 320a to a transferring substrate 350. Therefore, an LED array can be fabricated using the bonding layer 340. It should be noted that the patterns of the first bonding portion 340a and the second bonding portion 340b and the patterns of the pads 360a, 360b and 360c are not limited by the embodiment.

In summary, the LED and the method for fabricating the LED according to the present invention have at least the advantages of: 1. Compared with the conventional LED as shown in FIG. 1 which only uses conducting wires, the present invention inputs a driving voltage via a bonding layer together with conducting wires; therefore, the LED according to the present invention does not only have better current distribution, but also more contacting area (light emitting area); 2. Different from the conventional LED as shown in FIG. 1 and FIG. 2A, the driving voltage according to the present invention is applied via a bonding layer; thus, the LED according to the present invention requires a lower driving voltage; 3. Different from the conventional LED as shown in FIG. 2B which forming the ohmic contacting layer can be only performed after etching the doped semiconductor layer, the ohmic contacting layer is directly formed on the doped semiconductor layer; therefore, the method for fabricating the LED according to the present invention is relatively simple; 4. The present invention integrates a plurality of semiconductor island structures on a transferring substrate and fabricates an LED array structure with a bonding layer, which requires less conducting wires; and 5. The method for fabricating the LED is compatible with current processing, therefore the method for fabricating an LED according to the present invention demands no extra processing equipments.

It should be noted that specific embodiments of, and examples for, the invention are described herein for illustrative purposes, various equivalent modifications are possible within the scope of the invention, as those skilled in the relevant art will recognize that modifications and adaptations of the above-described preferred embodiments of the present invention may be made to meet particular requirements. This disclosure is intended to exemplify the invention without limiting its scope. All modifications that incorporate the invention disclosed in the preferred embodiment are to be construed as coming within the scope of the appended claims or the range of equivalents to which the claims are entitled.

What is claimed is:

1. A method for fabricating an LED, comprising:

successively forming & first type doped semiconductor layer, a light emitting layer and a second type doped semiconductor layer on an epitaxy substrate;

forming a bonding layer on the second type doped semiconductor layer; bonding a transferring substrate with the bonding layer of the epitaxy substrate;

removing the epitaxy substrate; removing a pat of the first type doped semiconductor layer, the light emitting layer and the second type doped semiconductor layer for exposing a part of a surface of the bonding layer;

patterning the bonding layer to form a first bonding portion and a second bonding portion which are isolated from each other; wherein the first type doped semiconductor layer, the light emitting layer and the second type doped semiconductor layer are disposed on the first bonding portion;

forming a first pad on the first type doped semiconductor layer; and forming a conducting wire for electrically connecting the first pad and the second bonding portion.

2. The method for fabricating an LED according to claim 1, before the step of forming the foregoing conducting wire, further comprising a step of forming a second pad on the first bonding portion and forming a third pad on the second bonding portion, wherein the second pad is electrically connected with the second type doped semiconductor layer via the first bonding portion, and the conducting wire is adapted for electrically connecting the first pad and the third pad.

3. The method for fabricating an LED according to claim 1, wherein the step of removing a part of the first type doped semiconductor layer, the light emitting layer and the second type doped semiconductor layer further comprises a step of forming a plurality of semiconductor island structures.

4. The method for fabricating an LIED according to claim 1, before the step of forming a first type doped semiconductor layer, further comprising a step of forming an epitaxy buffer layer on the epitaxy substrate.

5. The method for fabricating an LED according to claim 4, after the step of removing the epitaxy substrate, further comprising a step of removing the epitaxy buffer layer.

6. The method for fabricating an LED according to claim 1, before the step of Conning the bonding layer, further comprising a step of forming an ohmic contacting layer on the second type doped semiconductor layer.

7. The method for fabricating an LED according to claim 1, before the step of forming the bonding layer, further comprising a step of forming a reflective layer on the ohmic contacting layer.

8. The method for fabricating an LED according to claim 1, wherein the method for removing the epitaxy substrate comprises a laser lift-off processing.

9. The method for fabricating an LED according to claim 8, wherein the laser lift-off processing is performed with a quasi-molecule laser.

10. An LED comprising:

a substrate;

a bonding layer, disposed on the substrate, wherein the bonding layer comprises a first bonding portion and a second bonding portion which are isolated from each other;

a semiconductor layer, disposed an the first bonding portion, the semiconductor layer comprising a first type doped semiconductor layer, a light emitting layer, and a second type doped semiconductor layer, wherein the first type doped semiconductor layer is disposed on the bonding layer, and the light emitting layer is disposed between the first type doped semiconductor layer and the second type doped semiconductor layer;

a first pad disposed on the second type doped semiconductor layer; and a conducting wire, being adapted for electrically connecting the first pad with the second bonding portion.

11. The LED according to claim 10 further comprising a second pad and a third pad, wherein the second pad is disposed on the first bonding portion, and the second pad is electrically connected with the first type doped semiconductor layer via the first bonding portion; the third pad is disposed on a second bonding layer, and the conducting wire is adapted for electrically connecting the first pad with the third pad.

12. The LED according to claim 10, wherein the semiconductor layer further comprises a plurality of semiconductor island structures.

13. The LED according to claim 10 further comprising an ohmic contacting layer disposed on the bonding layer.

14. The LED according to claim 13 further comprising a reflective layer disposed between the ohmic contacting layer and the bonding layer.

15. The LED according to claim 10, wherein the first type doped semiconductor layer is an N-type doped semiconductor layer, and the second type doped semiconductor layer is a P-type doped semiconductor layer.

16. The LED according to claim 10, wherein the first type doped semiconductor layer is a P-type doped semiconductor layer, and the second type doped semiconductor layer is an N-type doped semiconductor layer.

17. The LED according to claim 10, wherein the light emitting layer is a multiple quantum well semiconductor layer.

* * * * *